United States Patent
Ravezzi et al.

(10) Patent No.: US 9,568,511 B2
(45) Date of Patent: Feb. 14, 2017

(54) HIGH FREQUENCY VOLTAGE SUPPLY MONITOR

(71) Applicant: APPLIED MICRO CIRCUITS CORPORATION, Sunnyvale, CA (US)

(72) Inventors: Luca Ravezzi, San Francisco, CA (US); Qawi Harvard, San Jose, CA (US); Hamid Partovi, Los Altos, CA (US)

(73) Assignee: APPLIED MICRO CIRCUITS CORPORATION, Santa Clara, CA (US)

( * ) Notice: Subject to any disclaimer, the term of this patent is extended or adjusted under 35 U.S.C. 154(b) by 211 days.

(21) Appl. No.: 14/208,408

(22) Filed: Mar. 13, 2014

(65) Prior Publication Data

US 2015/0323569 A1 Nov. 12, 2015

(51) Int. Cl.
*G01R 19/165* (2006.01)
*G01R 19/00* (2006.01)
*G06F 1/26* (2006.01)

(52) U.S. Cl.
CPC ..... *G01R 19/16552* (2013.01); *G01R 19/0007* (2013.01); *G06F 1/26* (2013.01)

(58) Field of Classification Search
None
See application file for complete search history.

(56) References Cited

U.S. PATENT DOCUMENTS

| | | | |
|---|---|---|---|
| 4,053,996 A | 10/1977 | Schertz et al. | |
| 4,151,471 A * | 4/1979 | Packard | H03G 11/04 327/552 |
| 4,357,852 A * | 11/1982 | Suenaga | G10H 3/182 84/454 |
| 5,604,463 A * | 2/1997 | Freuler | H03F 3/3076 330/149 |
| 7,436,216 B1 * | 10/2008 | Brunn | H03F 3/45183 326/83 |
| 7,719,361 B2 | 5/2010 | Pera | |
| 7,813,289 B2 * | 10/2010 | Partovi | G06F 13/4072 370/241 |
| 7,843,247 B1 | 11/2010 | Bazes | |
| 8,183,899 B2 | 5/2012 | Kanno et al. | |
| 8,183,925 B2 | 5/2012 | Ohta et al. | |
| 8,260,225 B2 | 9/2012 | Vinayak et al. | |

(Continued)

FOREIGN PATENT DOCUMENTS

JP 03-158768 7/1991

OTHER PUBLICATIONS

International Search Report & Written Opinion for PCT Application Serial No. PCT/US2015/042593, mailed Apr. 28, 2016, 12 pages.

*Primary Examiner* — Paresh Patel
(74) *Attorney, Agent, or Firm* — Amin, Turocy & Watson LLP

(57) ABSTRACT

Various aspects provide a high frequency voltage supply monitor capable of monitoring high frequency variations of the voltage supply inside a microelectronic circuit substantially in real time. The voltage supply monitor can comprise a differential amplifier circuit having a substantially constant gain over a wide bandwidth, allowing the supply voltage variations to be amplified according to a known gain under a wide range of conditions. The amplified signal can then be sent to an output port for monitoring and measurement by an external display device.

16 Claims, 9 Drawing Sheets

(56) References Cited

U.S. PATENT DOCUMENTS

| | | |
|---|---|---|
| 8,350,595 B2 | 1/2013 | Kanno et al. |
| 8,620,238 B2 | 12/2013 | Chan et al. |
| 2007/0188947 A1 | 8/2007 | Sung |
| 2010/0157495 A1* | 6/2010 | Densham .............. H01M 10/42 361/56 |
| 2010/0214711 A1 | 8/2010 | Torres |
| 2011/0096891 A1 | 4/2011 | Suzuki et al. |

* cited by examiner

HIGH FREQUENCY VOLTAGE SUPPLY MONITOR

TECHNICAL FIELD

The subject disclosure relates generally to power monitoring in digital systems, and more particularly to techniques for monitoring and measuring high frequency voltage excursions on the supply rails of an integrated circuit.

BACKGROUND

Microelectronic systems are often subject to voltage fluctuations on the power supply rails that deliver power to the various integrated circuit (IC) components that make up the systems. Spikes, oscillations, or other such power supply noise may cause unpredictable circuit responses, or otherwise degrade system performance and reliability. Power supply fluctuations become increasingly problematic as the nominal supply voltage of microelectronic circuits decreases, as with circuits using nanometer technologies designed to operate at lower supply voltages relative to older technologies. For example, some circuits using nanometer technologies are designed to operate at a 0.9 VDC supply voltage, compared with 5 VDC for older systems. As the nominal supply voltage decreases, so does system tolerance to power supply noise.

High frequency digital systems are particularly prone to power supply noise, since sudden changes in the system activity rate may cause spikes, droops, or even temporary oscillations on the voltage supply rails. Power rail spikes and oscillations are also a function of IR drops, or DC voltage drops due to parasitic resistances between the power supply and circuit components. Another source of power supply fluctuations is di/dt noise, or instantaneous voltage variations due to inductive effects on the power lines.

Monitoring the internal supply rail of a microelectronic circuit can be difficult. Although some systems include a monitoring system dedicated to monitoring the internal power supply line, such systems often have limited bandwidth, and consequently can only provide information on relatively low frequency variations on the power supply rails. These monitor systems can be used to compensate for IR and DC drops on the internal supply rails but are inadequate for high frequency noise caused mostly by di/dt fluctuations.

The above-described description is merely intended to provide a contextual overview of current techniques and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

Monitoring and measuring high frequency power supply fluctuations in real time can allow such fluctuations to be compensated for, thereby improving overall system performance. To this end, embodiments of the high frequency voltage supply monitor described herein can sense high frequency variations of an integrated circuit's internal supply voltage, amplify these measured variations, and deliver the resulting amplified signal to output pads for monitoring and measurement. The voltage supply monitor is designed to have a constant gain over a wide bandwidth, and is AC coupled to the power supply rails such that the monitor is sensitive only to high frequency voltage variations.

In example embodiments, the voltage supply monitor can comprise a differential amplifier circuit designed to have a limited gain, such that offsets in the circuit do not cause the amplifier to saturate, thus allowing the monitor to accurately detect AC variations of the internal supply voltage under a variety of conditions. In addition, the differential amplifier circuit has a well defined gain so that AC variations can be accurately measured and delivered to the specific compensation circuitry. The voltage supply monitor does not require calibration, sampling systems, or analog-to-digital (AD) converters.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
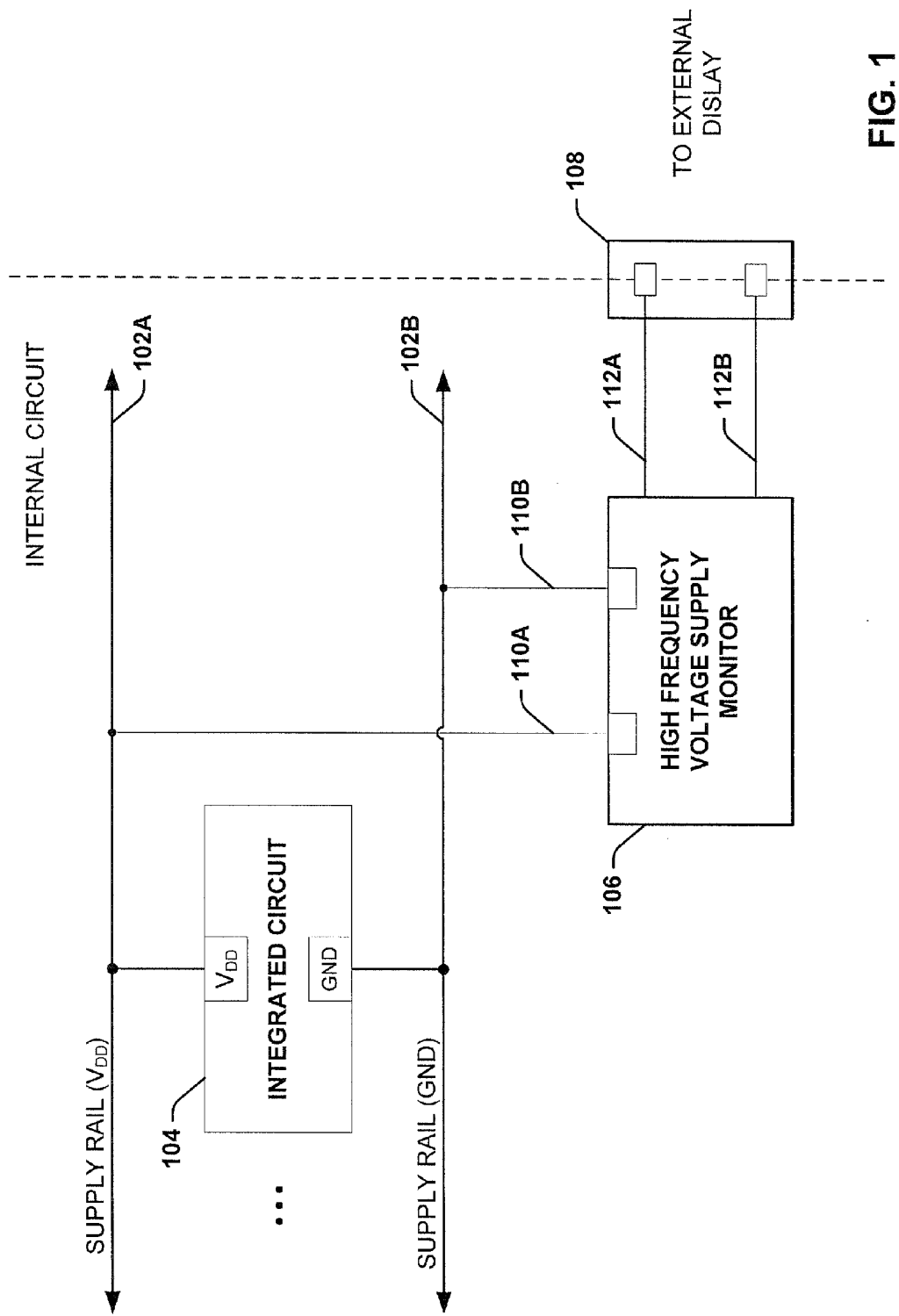
FIG. 1 is a high-level diagram of a microelectronic circuit that includes a voltage supply monitor for monitoring high frequency variations on the circuit's voltage supply rails.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Various aspects of the present disclosure provide a high frequency voltage supply monitor capable of monitoring high frequency variations on the internal power supply rails of an integrated circuit (e.g., a system-on-chip or other microelectronic circuit). FIG. 1 is a high-level diagram of a microelectronic circuit that includes a voltage supply monitor for monitoring high frequency variations on the circuit's voltage supply rails. The microelectronic circuit can comprise, for example, an integrated circuit (IC), a system of IC chips, a system-on-chip (SoC), or other such microelectronic system. The circuit includes one or more IC components—such as IC chip 104—which receive power via supply rails 102A and 102B.

The voltage on supply rails 102A and 102B may be susceptible to high frequency voltage fluctuations as a result of internal circuit characteristics, including but not limited to IR drop and di/dt noise. Moreover, sudden increases in the activity rate of the IC components 104 fed by supply rails 102A and 102B may cause voltage spikes or oscillations on the supply rails. These voltage variations may cause unpredictable or unreliable performance of the IC components, which may have low tolerances for power supply deviations.

In order to monitor and characterize these high frequency voltage fluctuations, a high frequency voltage supply monitor 106 is included as part of the internal circuit. In some embodiments, voltage supply monitor 106 may be part of the system's internal debug circuit. Input lines 110A and 110B of the high frequency voltage supply monitor 106 are electrically connected to supply rails 102A and 102B to facilitate monitoring and measuring high frequency voltage noise on the rails. Voltage supply monitor 106 detects high frequency voltage variations on supply rails 102A and 102B, amplifies the measured variations, and delivers the amplified measurements as signals to output pads 108 via output lines 112A and 112B or to internal circuitry for further elaboration and/or compensation.

Figure 2:
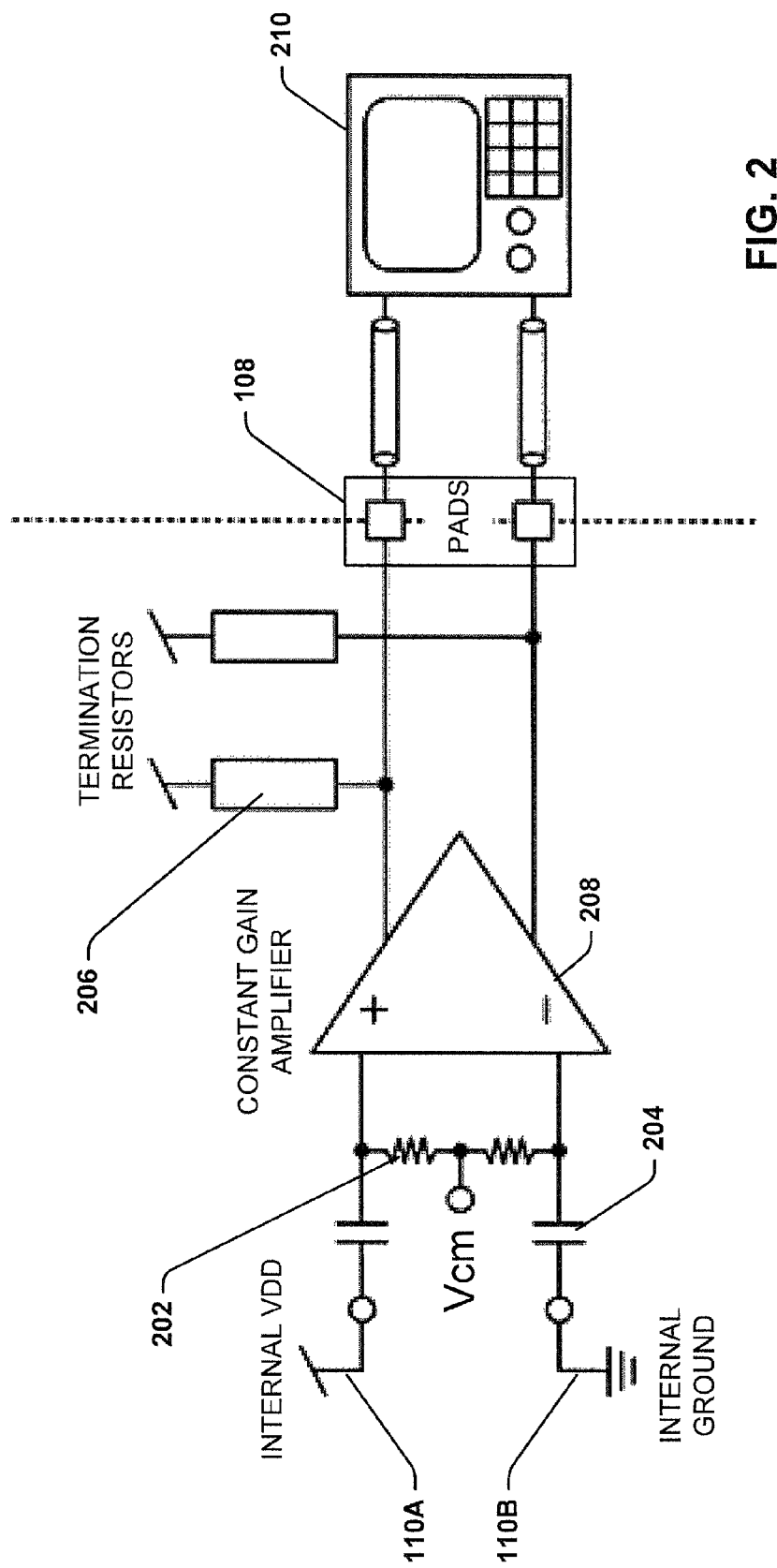
FIG. 2 illustrates a differential circuit that can be used to perform high frequency voltage monitoring of voltage supply rails.

In one or more embodiments, high frequency voltage supply monitor 106 can comprise a differential amplifier circuit characterized by a limited, relatively constant gain over a wide bandwidth, which allows the voltage supply monitor 106 to detect high frequency AC variations of the voltage on supply rails 102A and 102B. FIG. 2 illustrates an example differential circuit that can be used to perform high frequency voltage monitoring of voltage supply rails 102A and 102B. In this example embodiment, internal power supply rails 102A and 102B ($V_{DD}$ and ground, respectively) are AC connected to a differential amplifier 208 via capacitances 204 and resistors 202, which form a high-pass RC filter that passes high frequency voltage variations on power supply rails 102A to differential amplifier 208. The high-pass RC filter and differential amplifier 208 together form a differential amplifier circuit, which is biased to a suitable common-mode voltage (Vcm). The AC coupling renders the circuit sensitive only to high frequency voltage variations on supply rails 102A and 102B. In particular, the differential amplifier circuit is sensitive to the approximate frequency range of di/dt and fast IR drop phenomenon, the detection of which is the scope of the illustrated monitoring circuit. The common-mode voltage Vcm is selected such that the common-mode rejection ratio (CMRR) and the power-supply rejection ratio (PSRR) are maximized. In some embodiments, Vcm can be chosen close to $V_{DD}$.

The differential amplifier circuit depicted in FIG. 2 features a constant gain over a wide bandwidth. Consequently, the differential amplifier circuit is capable of amplifying measured supply voltage variations on supply rails 102A and 102B according to a known gain, and sending signals corresponding to the measured variations to output pads 108. A signal display device 210 (e.g., an oscilloscope or other display device) connected to output pads 108 can display the amplified signals in an appropriate format (e.g., value displays, graphs of the measured voltage variations over time, etc.). Termination resistors 206 can be used to match the impedance of the transmission lines connected to pads 108.

Figure 3:
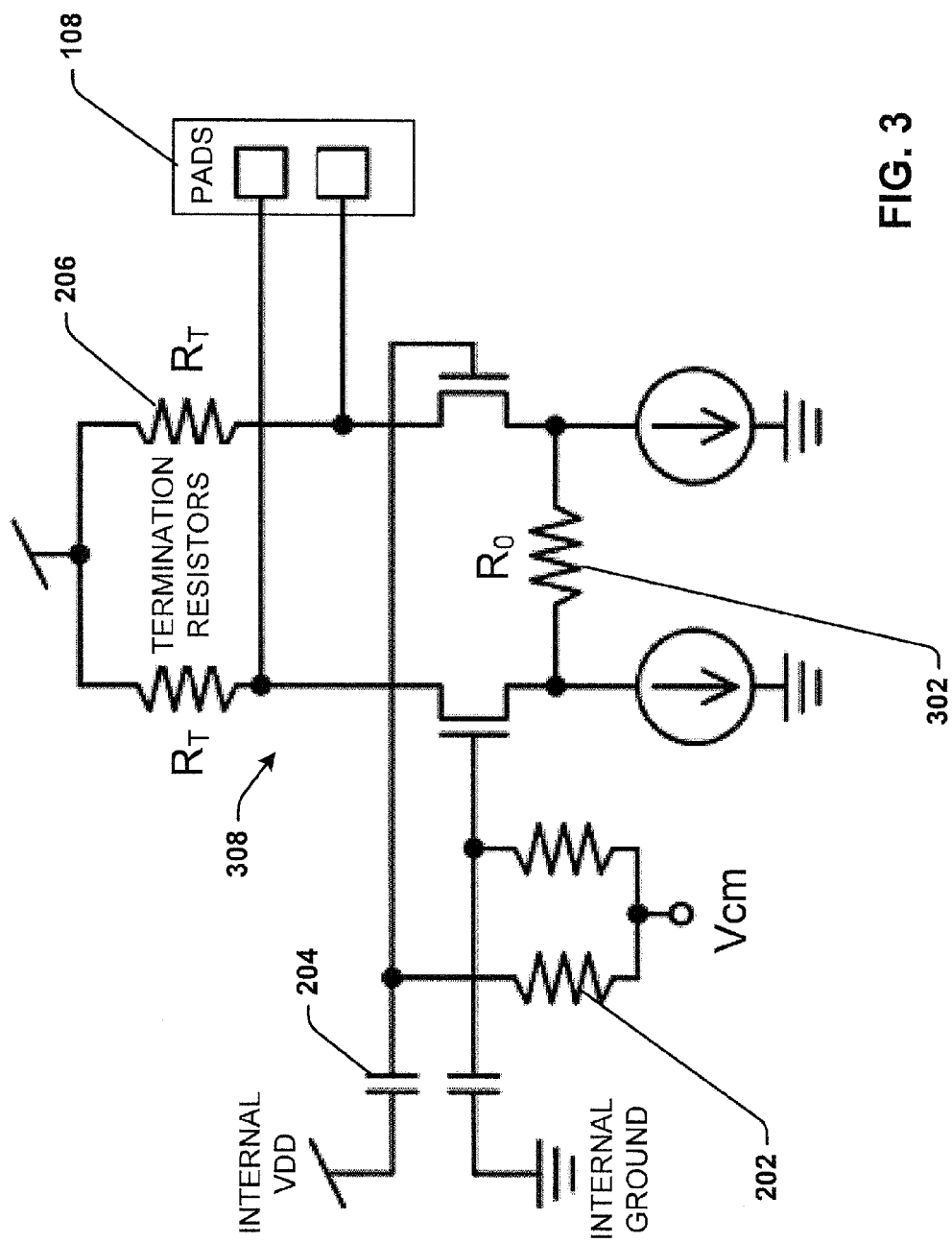
FIG. 3 illustrates a degenerative differential pair circuit capable of performing high frequency voltage monitoring of voltage supply rails.

The circuit illustrated in FIG. 2 illustrates the general principal of high frequency power voltage monitor 106. FIG. 3 illustrates an example implementation of the generalized circuit depicted in FIG. 2. In this example implementation, a degenerative differential pair circuit 308 represents the constant gain, wide bandwidth differential amplifier 208 of FIG. 2. The resistive load $R_T$ of the differential pair also functions as termination resistors 206 for the transmission line connected to pads 108. The common-mode voltage Vcm is chosen close to $V_{DD}$ (the nominal voltage of power supply rail 102A) so that the amplifier has a suitable CMRR and PSRR.

In one or more embodiments, the capacitances 204 can be implemented as fringe-metal capacitances or n-type metal-oxide semiconductor (NMOS) in N-well capacitances. The resistors 202 for biasing the differential pair input pins are selected to be large enough such that the circuit has a wide bandwidth.

The ratio between the termination resistors 206 and the degenerative resistor(s) 302 defines the amplifier gain of the circuit, and is equal to:

$$\text{Gain} = \frac{2R_T}{R_0}$$

Because of the limited gain of the amplifier circuit depicted in FIG. 3, any offset in the circuit will not cause the amplifier to saturate, thus allowing the circuit to detect the AC variations of the internal supply voltage under a wide range of conditions.

Figure 4:
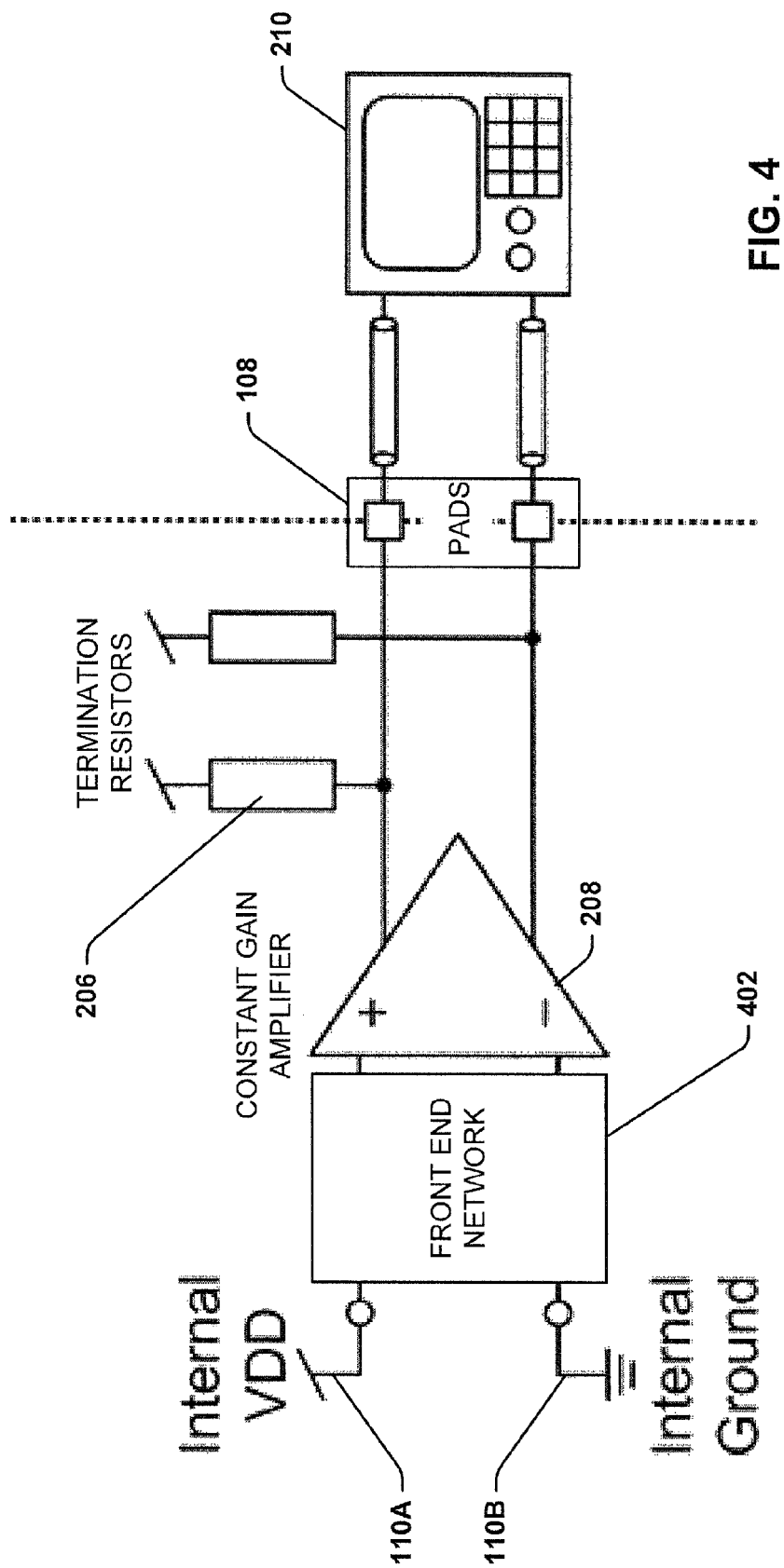
FIG. 4 illustrates an example circuit capable of monitoring both high-frequency and low-frequency voltage variations.

The circuits illustrated in FIGS. 2 and 3 are designed to be sensitive only to high frequency voltage variations on supply rails 102A and 102B. However, some embodiments of the voltage supply monitor can be configured to monitor both high frequency and low frequency variations on the supply rail. FIG. 4 illustrates an example circuit capable of monitoring both high frequency and low frequency variations. In this example, the high-pass RC filter comprising capacitances 204 and resistors 202 has been replaced with a front-end network 402 capable of passing both high frequency voltage variations as well as low frequency voltage variations (including DC deviations) measured on supply rails 102A and 102B. Similar to the examples described above, the differential amplifier circuit amplifies these detected variations and sends corresponding signals to pads 108, so that the voltage variations can be monitored by a display device 210.

The monitoring circuits depicted in FIGS. 2-4 are capable of monitoring high frequency variations of a voltage supply substantially in real time. Moreover, the relatively low complexity of the described monitoring circuits eliminates the need for calibration. Also, the monitoring circuits are able to perform high frequency voltage monitoring without the need for sampling systems or analog-to-digital converters.

Figure 5:
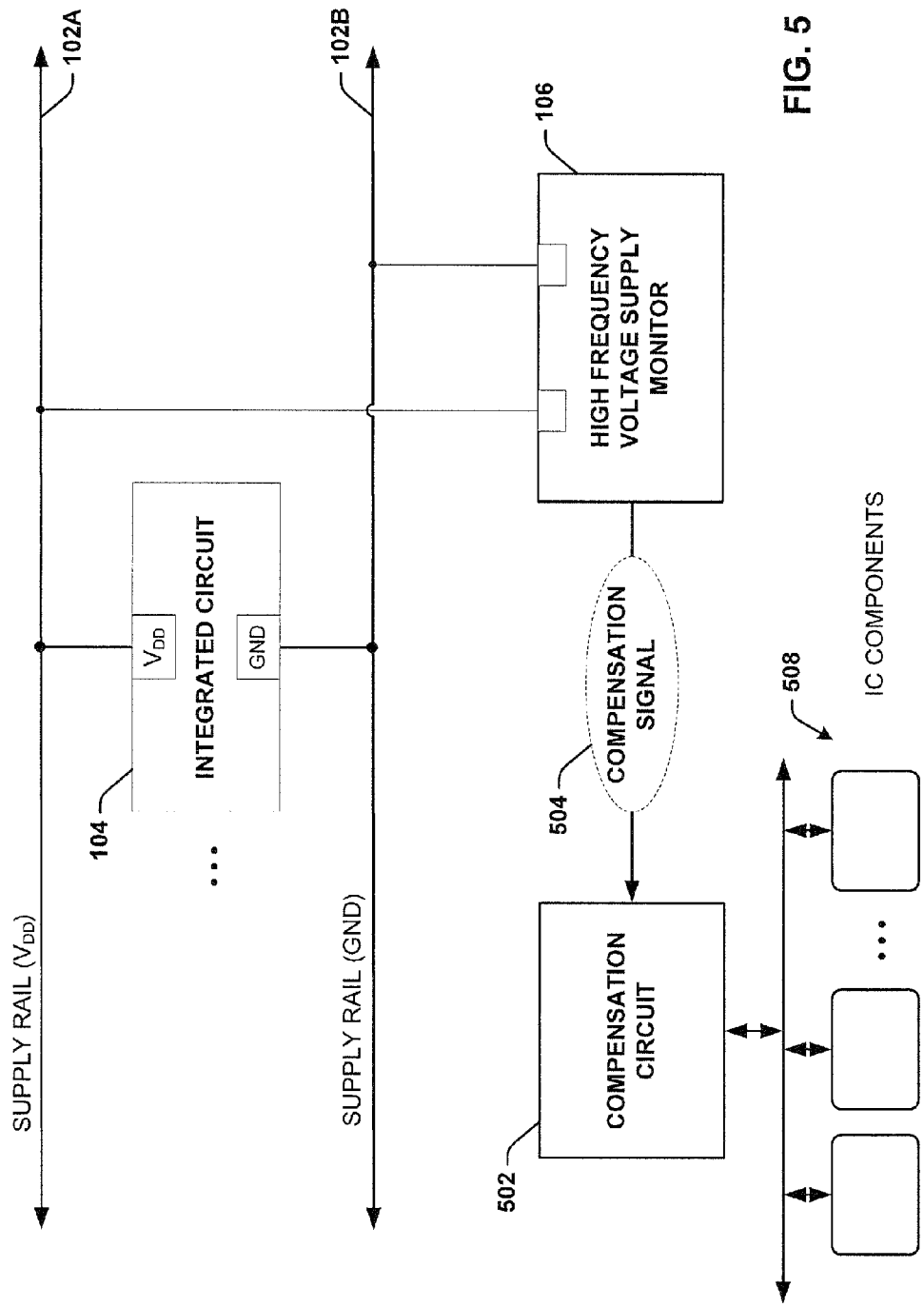
FIG. 5 is a high-level diagram of an example microelectronic system that performs real time circuit compensation based on measured voltage variations.

In the examples illustrated in FIGS. 1-4, the high frequency voltage supply monitor provides the amplified voltage variation measurements to output pads to allow the amplified signals to be visualized on a display device. In other embodiments, the measured output signals may be used internally by the microelectronic system to perform real-time compensation in response to detected voltage variations. FIG. 5 illustrates an example microelectronic system that leverages the measured voltage variations to perform real time circuit compensation and counteract the effects of spikes or oscillations on the supply rails 102A and 102B. In this example, voltage supply monitor 106 monitors and measures high frequency AC noise on supply rails 102A and 102B, as described in previous examples. Based on these measurements, voltage supply monitor 106 delivers a compensation signal 504 to a compensation circuit 502 designed to alter operation of one or more IC components 508 in response to a determination (by either the voltage supply monitor 106 or compensation circuit 502) that the measured voltage variations satisfy a defined criterion.

For example, in response to detection of a high frequency voltage oscillation on voltage supply rails 102A and 102B, the voltage supply monitor 106 may send a compensation signal 504 to compensation circuit 502 reporting the occurrence of AC noise on the supply rails. In response to the compensation signal 504, compensation circuit 502 may curtail, limit, or disable operation of one or more IC components 508 of the microelectronic system in order to reduce the possibility of adverse operation. In an example implementation, compensation circuit 502 may be configured to curtail, limit, or disable operation of specific IC components 508 that are prone to unreliable or unpredictable operation in the presence of high frequency voltage variations on supply rails 102A and 102B. In another example implementation, compensation circuit 502 may be configured to curtail, limit, or disable operation of one or more IC components 508 identified as being non-critical to system operation, thereby reducing the overall system activity rate. Since elevated system activity rates may be a cause of undesired voltage fluctuations, lowering the system activity rate in this manner can at least partially mitigate the high frequency voltage variations as they are detected by the voltage supply monitor 106.

Figure 6:
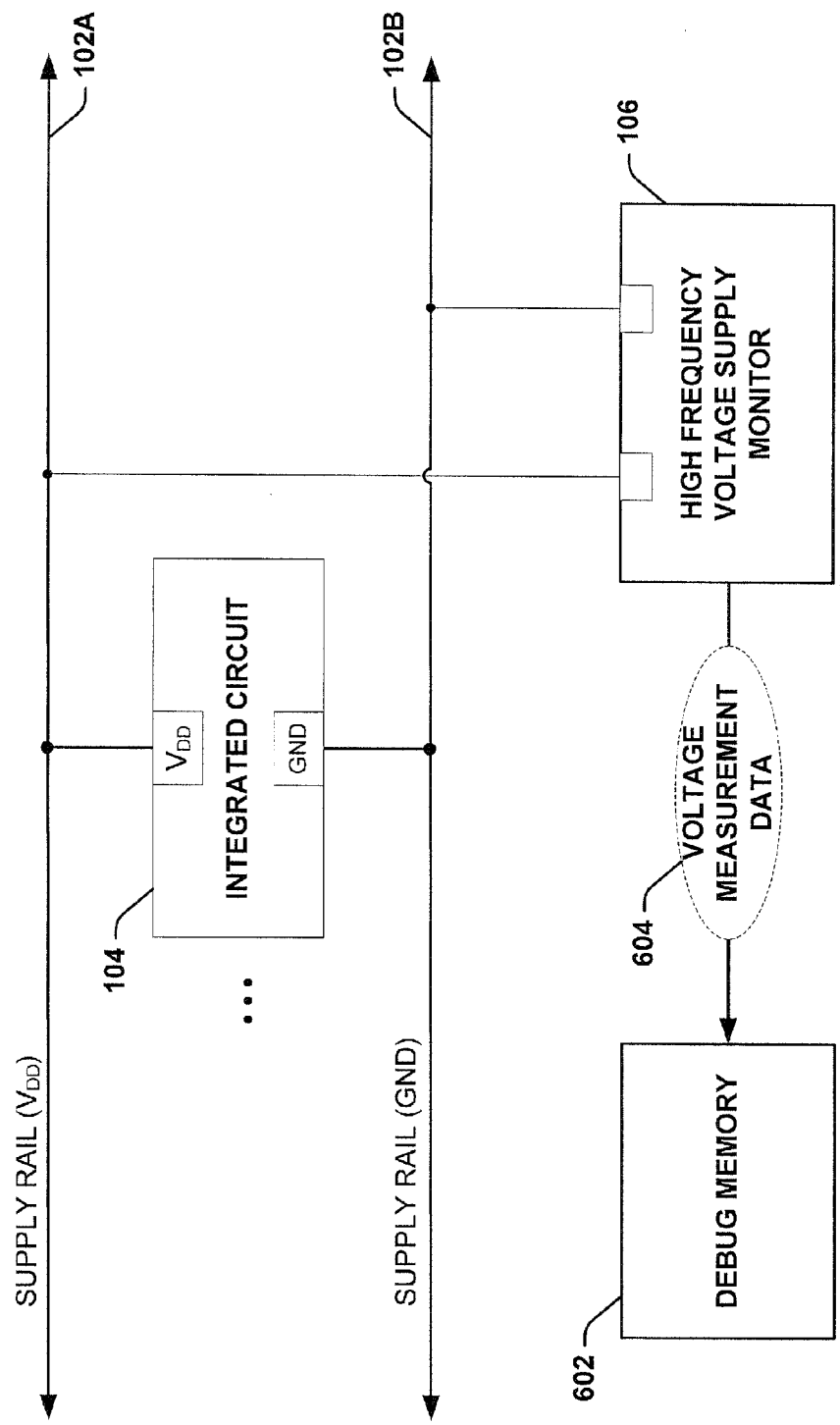
FIG. 6 is a high-level diagram of a system for logging data relating to measured voltage variations on the voltage supply rails of a microelectronic circuit.

FIG. 6 illustrates another example application of voltage supply monitor 106. In this example, voltage measurement data 604 measured by voltage supply monitor 106 is delivered to a local debug memory 602 for storage. In some embodiments, voltage supply monitor 106 may continuously log voltage measurement data 604 to debug memory 602 during operation of the microelectronic system. In other embodiments, voltage supply monitor 106 may record only critical voltage variations detected during operation, where such critical variations are identified by a determination that a measured characteristic of the voltage variations satisfy a defined criterion. For example, voltage supply monitor 106 may be configured to record voltage measurement data 604 to debug memory 602 in response to detecting that a high frequency voltage oscillation exceeds a defined frequency, or has persisted for a defined period of time. Other suitable logging criteria are also within the scope one or more embodiments of this disclosure. Debug memory 602 can subsequently be accessed by an external display device so that the recorded voltage data can be viewed (e.g., during a system debug mode).

Figure 7:
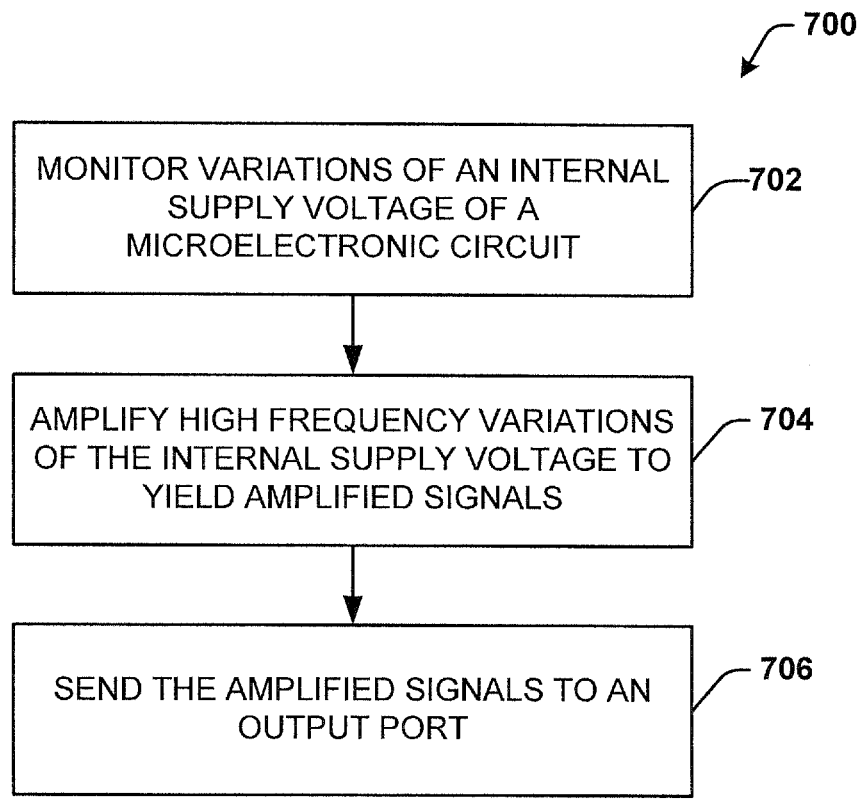
FIG. 7 illustrates a flow diagram of an example, non-limiting embodiment of a method for monitoring high frequency voltage variations on the supply rails of a microelectronic system.
Figure 8:
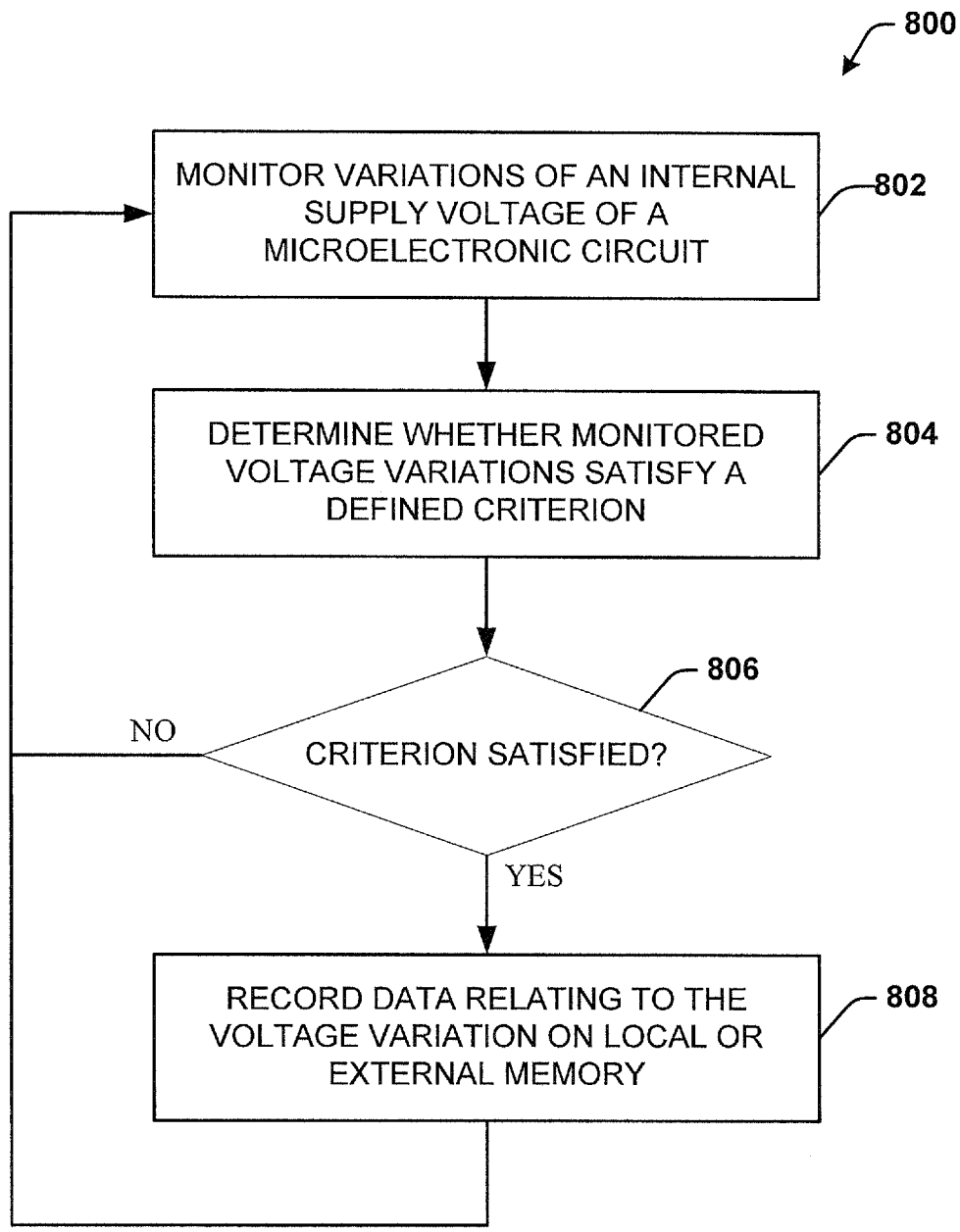
FIG. 8 illustrates a flow diagram of an example, non-limiting embodiment of a method for recording high frequency voltage variations detected on the supply rails of a microelectronic system.
Figure 9:
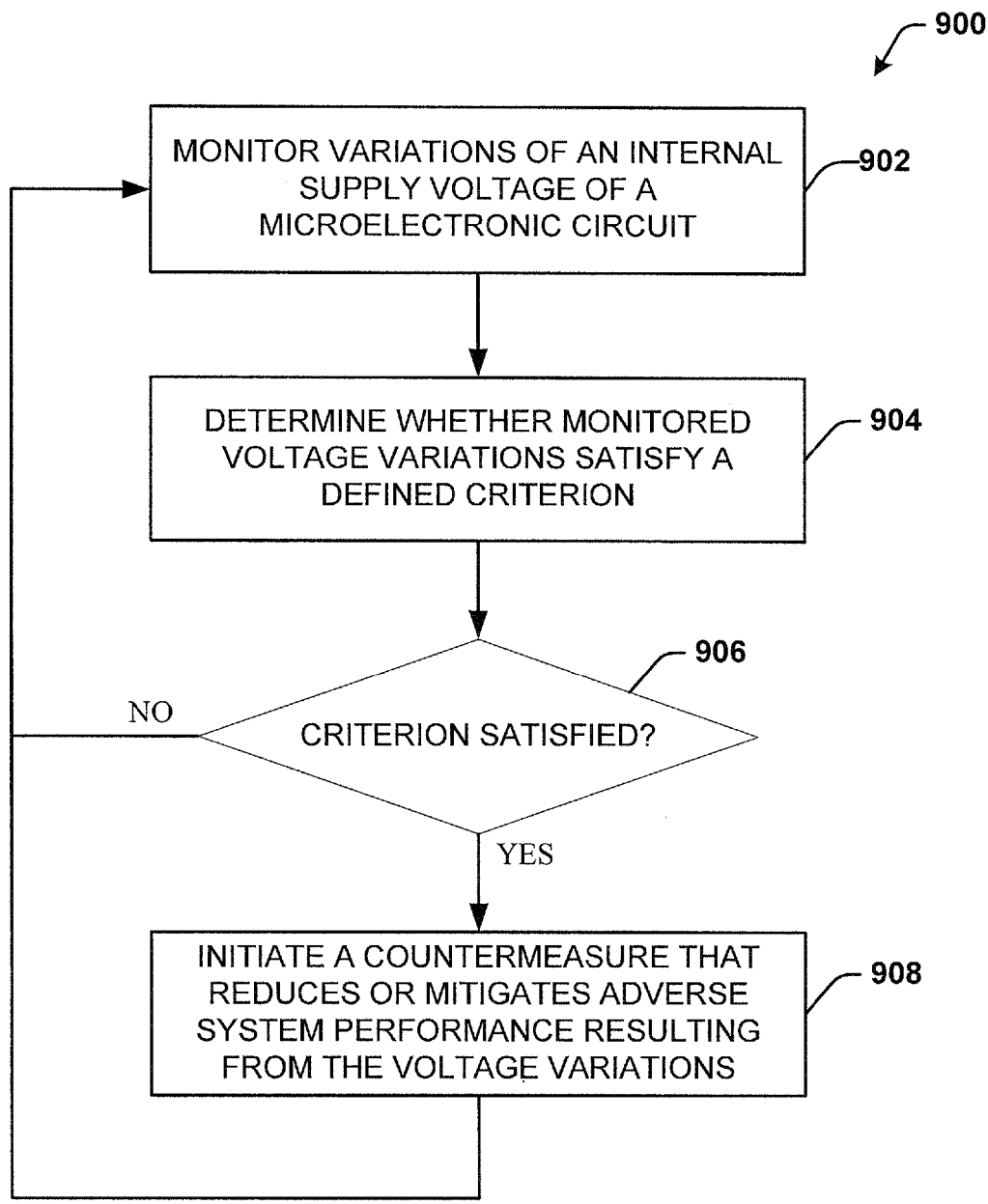
FIG. 9 illustrates a flow diagram of an example, non-limiting embodiment of a method for compensating for high frequency voltage variations detected on the supply rails of a microelectronic system.

In view of the example systems described above, methods that may be implemented in accordance with the described subject matter may be better appreciated with reference to the flowcharts of FIGS. 7-9. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Referring to FIG. 7, a flow diagram of an example, non-limiting embodiment for monitoring high frequency voltage variations on the supply rails of a microelectronic system is shown. Method 700 can begin at block 702, where variations of an internal supply voltage of a microelectronic circuit are monitored. The supply voltage can be monitored, for example, by a high frequency voltage supply monitor capable of measuring high frequency voltage variations (e.g., high frequency AC noise) on the power supply rails that deliver power to the IC components that make up the microelectronic circuit. At block 704, the measured high frequency variations of the internal supply voltage are amplified. The high frequency variations can be amplified using any suitable circuit, including but not limited to a differential amplifier circuit having a consistent gain over a wide bandwidth. At block 706, the amplified signals are sent to an output port for monitoring and display by an external display device (e.g., an oscilloscope or other display device).

Referring to FIG. 8, a flow diagram of an example, non-limiting embodiment for recording high frequency voltage variations detected on the supply rails of a microelectronic system is shown. Method 800 can begin at block 802, where variations of an internal supply voltage of a microelectronic circuit are monitored; e.g., using a high frequency voltage supply monitor as described in previous examples. At block 804, a determination is made regarding whether the monitored voltage variations satisfy a defined criterion. In a non-limiting example, the defined criterion may correspond to a determination that a detected voltage variation exceeds a defined frequency, or has persisted for a defined period of time. If it is determined at block 806 that the defined criterion is not satisfied, the methodology returns to block 802 and monitoring continues. Alternatively, if it is determined at block 806 that the defined criterion is satisfied, data relating to the detected voltage variation is recorded on local or external memory at block 808. In some embodiments, the memory can comprise internal debug memory of the microelectronic system, which can be accessed and viewed while the system is placed in a debug mode.

Referring to FIG. 9, a flow diagram of an example, non-limiting embodiment for recording high frequency voltage variations detected on the supply rails of a microelectronic system is shown. Method 900 can begin at block 902, where variations of an internal supply voltage of a microelectronic circuit are monitored; e.g., using a high frequency voltage supply monitor as described in previous examples. At block 904, a determination can be made regarding whether the monitored voltage variations satisfy a defined criterion. In a non-limiting example, the defined criterion may correspond to a determination that a detected voltage variation exceeds a defined frequency, or has persisted for a defined period of time. If it is determined at block 906 that the defined criterion is not satisfied, the methodology returns to block 902 and monitoring continues. Alternatively, if it is determined at block 906 that the defined criterion is satisfied, a countermeasure is initiated at step 908 that reduces or mitigates adverse system performance resulting from the detected voltage variations. In an example embodiment, the countermeasure can be implemented by a compensation circuit that curtails, limits, or disables operation of one or more IC components of the microelectronic system in response to the determination that the detected variations satisfy the criteria in order to reduce the possibility of adverse or unpredictable operation.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system for monitoring voltage variations, comprising:
    a differential amplifier circuit comprising a high-pass filter configured to generate a signal in response to detection of a voltage variation that exceeds a defined frequency on a power supply rail of a microelectronic circuit, the differential amplifier circuit further comprising a differential amplifier that amplifies the signal from the high-pass filter to yield an amplified signal representing the voltage variation, wherein a first input of the differential amplifier circuit and a second input of the differential amplifier circuit are electrically connected to a common mode voltage via respective resistors, and wherein the common mode voltage is substantially equal to a nominal voltage of the power supply rail; and
    a compensation component connected to the differential amplifier circuit and one or more components of the microelectronic circuit, the compensation component configured to, in response to receiving a signal from the differential amplifier circuit indicating that the amplified signal indicates a high frequency oscillation on the power supply rail, initiate a countermeasure that modifies a behavior of the one or more components of the microelectronic circuit, wherein the countermeasure comprises at least one of disablement the one or more components of the microelectronic circuit or reduction of an activity rate of the one or more components of the microelectronic circuit.

2. The system of claim 1, wherein the high-pass filter comprises at least one capacitor and at least one resistor that couple the power supply rail to the differential amplifier circuit.

3. The system of claim 1, wherein the differential amplifier circuit comprises a degenerative differential pair circuit having a substantially constant gain over a defined bandwidth.

4. The system of claim 2, further comprising one or more termination resistors connected between output lines of the differential amplifier circuit and the power supply rail.

5. The system of claim 1, further comprising a logging component configured to store a record of the amplified signal in a local memory or an external memory in response to detecting that a high frequency voltage oscillation represented by the amplified signal exceeds the defined frequency.

6. A method for detecting high frequency voltage variations, comprising:
    detecting, at an input of a high-pass filter of a differential amplifier circuit comprising the high-pass filter and a differential amplifier, a voltage variation on a power supply rail of a microelectronic circuit, wherein a first input of the differential amplifier circuit and a second input of the differential amplifier circuit are electrically connected to a common mode voltage via respective resistors, and wherein the common mode voltage is substantially equal to a nominal voltage of the power supply rail;
    generating, at an output of the high-pass filter, a signal based on the voltage variation;
    amplifying, by the differential amplifier circuit, the signal to yield an amplified signal representing the voltage variation; and
    sending, by the differential amplifier circuit, the amplified signal to a compensation circuit connected to the differential amplifier circuit;
    in response to a determination that the amplified signal indicates presence of noise on the power supply rail, initiating, by the compensation circuit, a countermeasure that at least one of disables a component of the microelectronic circuit or curtails an activity rate of the component of the microelectronic circuit, wherein the component of the microelectronic circuit is connected to the compensation circuit.

7. The method of claim 6, wherein the amplifying comprises amplifying the signal using a degenerative differential pair circuit as the differential amplifier.

8. The method of claim 7, further comprising matching an impedance of a transmission line that sends the amplified signal to a display device, wherein the matching comprises matching using one or more termination resistors connected between the transmission line and the power supply rail.

9. The method of claim 6, further comprising logging a record of the voltage variation in a memory based on the amplified signal.

10. A power monitoring system, comprising:
    means for monitoring voltage fluctuations on a power supply rail of an integrated circuit using a differential amplifier circuit comprising a high-pass filter and a differential amplifier;
    means for biasing an input of the differential amplifier circuit using a common mode voltage that is substantially equal to a nominal voltage of the power supply rail;
    means for generating a signal based on the voltage fluctuations;
    means for amplifying the signal to yield an amplified signal capable of being measured by a display device; and
    means for instructing a compensation circuit connected to the differential amplifier circuit to initiate a countermeasure that at least one of disables a component of the integrated circuit or curtails an activity rate of the component of the integrated circuit in response to a determination that the amplified signal is indicative of a high frequency oscillation on the power supply rail, wherein the compensation circuit is connected to the component of the integrated circuit.

11. The power monitoring system of claim 10, wherein the means for generating comprises means for generating the signal based on a subset of the voltage fluctuations that exceed a defined frequency.

12. The system of claim 5, wherein the logging component is configured to store the record of the amplified signal in the local memory or the external memory in response to detecting that the high frequency voltage oscillation represented by the amplified signal has persisted for a defined period of time.

13. The method of claim 9, wherein the logging comprises logging the record in response to a determination that the voltage variation exceeds a defined frequency.

14. The method of claim 13, wherein the logging comprises logging the record in response to a determination that the voltage variation has persisted for a defined period of time.

15. The power monitoring system of claim 10, further comprising means for logging a record of the voltage fluctuations in response to a determination, based on the amplified signal, that the voltage fluctuations exceed a defined frequency.

16. The power monitoring system of claim 15, wherein the means for logging comprises means for logging the record in response to a determination, based on the amplified signal, that the voltage fluctuations have persisted for a defined period of time.

* * * * *